(12) United States Patent
Tipirneni et al.

(10) Patent No.: US 12,113,062 B2
(45) Date of Patent: Oct. 8, 2024

(54) FRINGE CAPACITOR, INTEGRATED CIRCUIT AND MANUFACTURING PROCESS FOR THE FRINGE CAPACITOR

(71) Applicant: TEXAS INSTRUMENTS INCORPORATED, Dallas, TX (US)

(72) Inventors: Naveen Tipirneni, Frisco, TX (US); Maik Peter Kaufmann, Freising (DE); Michael Lueders, Freising (DE); Jungwoo Joh, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 39 days.

(21) Appl. No.: 17/137,784

(22) Filed: Dec. 30, 2020

(65) Prior Publication Data

US 2022/0208755 A1 Jun. 30, 2022

(51) Int. Cl.
*H01L 27/06* (2006.01)
*H01L 21/8252* (2006.01)
*H01L 29/20* (2006.01)
*H01L 29/66* (2006.01)
*H01L 29/778* (2006.01)
*H01L 49/02* (2006.01)
*H02M 3/156* (2006.01)
*H03K 3/037* (2006.01)

(52) U.S. Cl.
CPC ...... *H01L 27/0629* (2013.01); *H01L 21/8252* (2013.01); *H01L 27/0605* (2013.01); *H01L 28/60* (2013.01); *H01L 29/2003* (2013.01); *H01L 29/66462* (2013.01); *H01L 29/7781* (2013.01); *H02M 3/156* (2013.01); *H03K 3/0377* (2013.01)

(58) Field of Classification Search
CPC ............ H01L 27/0218; H01L 27/0629; H01L 27/0605; H01L 27/10; H01L 21/8252; H01L 28/60; H01L 28/40; H01L 28/88; H01L 28/90; H01L 28/92; H01L 29/122–127; H01L 29/15–158; H01L 29/2003; H01L 29/66462; H01L 29/66431; H01L 29/778–7789; H01L 23/5223; H01L 25/0655; H01L 25/072; H01L 29/7781; H01L 29/7783; H01L 29/78681; H01L 29/92; H01L 29/93; H01L 2924/13064
USPC ..... 257/76, 77, 499; 438/250, 393, 626–641
See application file for complete search history.

(56) References Cited

U.S. PATENT DOCUMENTS

| | | | | |
|---|---|---|---|---|
| 6,228,707 | B1 * | 5/2001 | Lin | H01L 28/40 438/626 |
| 6,465,297 | B1 * | 10/2002 | Henry | H01L 28/40 257/E21.28 |
| 2007/0228506 | A1 * | 10/2007 | Min | H01G 4/33 361/306.3 |

(Continued)

*Primary Examiner* — Natalia A Gondarenko
(74) *Attorney, Agent, or Firm* — Yudong Kim; Frank D. Cimino

(57) ABSTRACT

The present invention provides a capacitor having a first structure made of a metal layer and a second structure made of the same metal layer and a dielectric layer between the first and the second metal structure, wherein the dielectric layer has a relative permittivity greater than 4, in particular greater than 6. It also provides a monolithically integrated circuit including such a capacitor and optionally other components. A method of manufacturing such a capacitor is also provided.

20 Claims, 7 Drawing Sheets

(56) References Cited

U.S. PATENT DOCUMENTS

| | | | | |
|---|---|---|---|---|
| 2010/0020509 A1* | 1/2010 | Xie | ........................ | H01L 28/40 |
| | | | | 216/6 |
| 2011/0037509 A1* | 2/2011 | Herzer | ........... | H03K 19/018521 |
| | | | | 327/333 |
| 2011/0181258 A1* | 7/2011 | Ivanov | ...................... | G05F 1/56 |
| | | | | 323/234 |
| 2012/0256193 A1* | 10/2012 | Hebert | .............. | H01L 23/49562 |
| | | | | 257/532 |
| 2014/0211357 A1* | 7/2014 | Matsuoka | ........... | H01L 23/5223 |
| | | | | 361/111 |
| 2017/0330940 A1* | 11/2017 | Lee | .................... | H01L 27/0605 |
| 2018/0090993 A1* | 3/2018 | Markhi | ............. | H02M 3/33592 |
| 2018/0343003 A1* | 11/2018 | Huang | ............. | H03K 3/356017 |
| 2020/0144253 A1* | 5/2020 | Jones, III | ................ | H01L 28/87 |
| 2021/0134968 A1* | 5/2021 | Haeberlen | .......... | H03K 17/6871 |
| 2022/0165726 A1* | 5/2022 | Ting | ........................ | H01L 29/93 |

* cited by examiner

FRINGE CAPACITOR, INTEGRATED CIRCUIT AND MANUFACTURING PROCESS FOR THE FRINGE CAPACITOR

FIELD

The present disclosure relates to a fringe capacitor, an integrated circuit and a manufacturing process for such a capacitor.

BACKGROUND

Existing integrated circuits according to the prior art fail to provide integrated capacitors being suitable for high voltages, as for example 400 V, while having sufficiently high densities (capacitance) at the same time.

SUMMARY

It is an object of the present disclosure to provide a capacitor, integrated circuits comprising a capacitor and a manufacturing process for such a capacitor and integrated circuits which are suitable for high voltage applications while still providing sufficiently large capacitance values.

In aspect, there is a capacitor comprising a first structure made of a metal layer and a second structure made of the same metal layer and a dielectric/protective layer between the first and the second metal structure. The dielectric/protective layer can have a relative permittivity greater than 4, in particular greater than 6. The dielectric layer can comprise silicon nitride ($Si_3N_4$). The permittivity of silicon nitride is typically greater than 4 or even greater than 6.

The first structure/electrode can be a line and the second structure/electrode can also be a line. The first and the second structure can be interdigitated.

The present disclosure also provides a capacitor manufactured in a high voltage manufacturing process for integrated electronic components. The manufacturing process provides silicon nitride. The silicon nitride is used as a dielectric layer between electrodes of the capacitor. The electrodes are made in the same metal layer.

Further, a capacitor is provided having electrodes made in the same metal layer. The electrodes are electrically isolated from each other by a layer of silicon nitride.

The present disclosure also provides a monolithic integrated electronic circuit comprising a capacitor and at least one power transistor, wherein the capacitor and the transistor are manufactured in the same high voltage manufacturing process.

Moreover, a monolithic integrated circuit is provided comprising a fringe capacitor having electrodes within the same metal layer. One of the electrodes is configured to be coupled to a high voltage domain and the other electrode is configured to be coupled to a low voltage domain.

The capacitor can be implemented as part of monolithic high-voltage power-stage. The capacitor can be implemented as a port of a monolithic high-voltage switch-mode converter. Application examples comprise level-shifting, zero-detection and slew-rate control. The capacitor can be a feedback capacitor in a voltage or current converter, in particular DC-DC converter, in particular in a buck or boost converter. The capacitor can be coupled to provide zero detection to other integrated electronic components.

There is also a method of manufacturing an integrated capacitor comprising the following steps: depositing a (first) metal layer, structuring (etching) the metal layer into at least a first structure and a second structure being (electrically decoupled) distinct from each other.

The method can further comprise a step of providing a minimum distance between the first structure and the second structure in order to comply with high voltage requirements.

In the method, there can further be a step of depositing a non-conductive layer at least between the first structure and the second structure, such that the first structure and the second structure form the electrodes of a capacitor. The non-conductive layer can have a permittivity of at least four and more particularly of at least six. The conductive layer can comprise or consist of silicon nitride.

The method may further comprise the steps of depositing and structuring the layers for a power transistor, creating the power transistor using the layers such that the transistor is monolithically integrated with the capacitor. The transistor and the capacitor can be electrically coupled.

The manufacturing process can be a III-Nitride power manufacturing process, in particular a Gallium Nitride (GaN) integrated circuit power platform process.

The above aspects assist in providing a capacitor having high density (great capacitance), lower parasitic bottom plate capacitance and suitability for high voltage applications. The capacitor can be integrated with other components such as power transistors etc.

Furthermore, the present disclosure provides a high density and high voltage fringe capacitor without adding to process complexity by adding manufacturing steps, mask count or requiring thick inter layer dielectrics (ILD) between metal layers.

BRIEF DESCRIPTION OF DRAWINGS

Further aspects and characteristics of the present application will ensue from the following description of preferred examples with reference to the accompanying drawings, wherein.

DETAILED DESCRIPTION OF EMBODIMENTS

Figure 1:
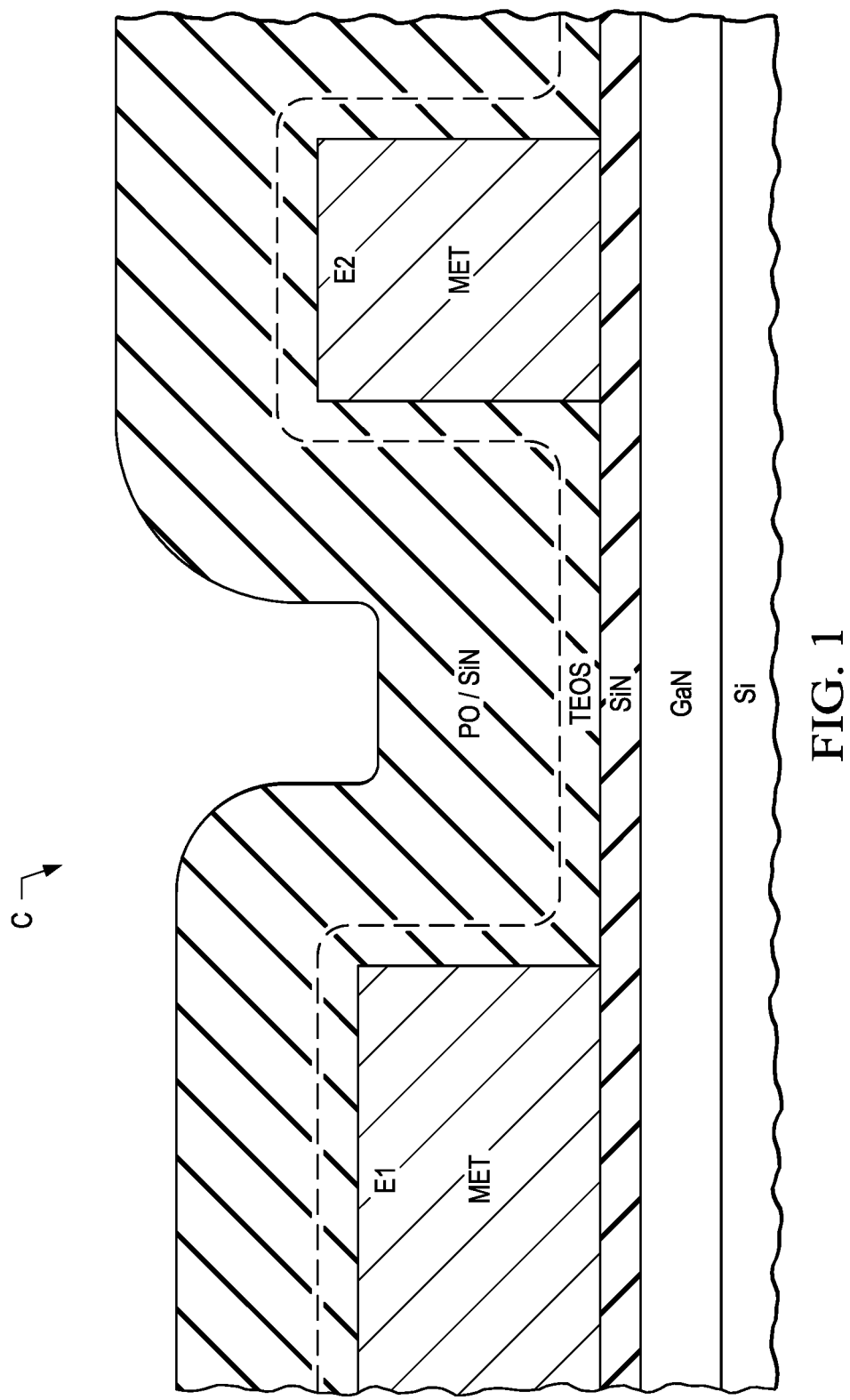
FIG. 1 is a simplified cross sectional view of a capacitor according to the present disclosure.

FIG. 1 is a simplified cross sectional view of a capacitor C according to the present disclosure. The capacitor is monolithically formed on a silicon substrate Si that is covered by a layer of gallium nitride GaN. The GaN layer can further be covered by a non-conductive layer. The non-conductive layer can be made, for example of SiO2, or SiON, or any low-k or high-k dielectrics or silicon nitride (Si3N4). The shown structure of the capacitor C is also referred to as a fringe capacitor. The capacitor C comprises a first structure E1 (first electrode) made of a metal layer MET and a second structure E2 (second electrode) made of the same metal layer MET and a dielectric layer (also referred to as protective layer PO) between the first structure E1 and the second structure E2. The dielectric layer/protective layer PO has a relative permittivity greater than the permittivity of silicon oxide. The permittivity of the dielectric/protective layer can be greater than 4 or even greater than 6. The protective layer or dielectric layer comprises silicon nitride Si3N4. Between the metal layer MET and the protective layer PO there may also be a stress reducing further layer. This further layer is indicated by the dashed line and may be a Tetraethoxysilane (TEOS) layer. The metal layer MET can comprise or consist of aluminum Al. It can also comprise or consists of a stack of layers of titanium, aluminum and titanium nitride (Ti/Al/TiN) The first and the second structure can be interdigitated.

The capacitor C can advantageously be manufactured in a high voltage manufacturing process for integrated electronic components. In this context "high voltage" refers to a voltage greater than at least some tens of Volts, in particular equal to or greater than 100 V and more specifically equal to or greater than 400 V. The manufacturing process preferably provides silicon nitride Si3N4 and the silicon nitride Si3N4 is used as a dielectric layer between the electrodes E1, E2 of the capacitor. The electrodes E1, E2 are provided in the same electrically conductive layer. The conductive layer can be a metal layer MET and the metal layer MET can be aluminum Al. The metal layer MET can have a thickness that is configured to comply with high voltages and/or high currents. The metal layer MET can have a thickness from at least 1 um or at least 3 um.

Figure 2:
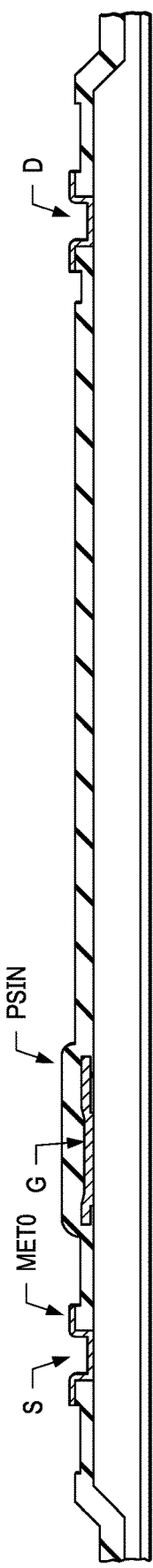
FIG. 2 is a cross sectional view of a first manufacturing stage in a manufacturing method of manufacturing a capacitor and optionally other components of an integrated electronic circuit.

FIG. 2 is a cross sectional view of a first manufacturing stage in a manufacturing method of manufacturing a capacitor and optionally other components of an integrated electronic circuit. At this stage there has been a silicon nitride Si3N4 deposition on layer of gallium nitride GaN which resides on top of the silicon substrate. It is noted that the first stages and steps rather relate to the manufacturing of a transistor and may be omitted if only one or more capacitors are to be manufactured. The relevant stages and steps for the capacitor C are disclosed in later stages. In the next step the contacts for a source S and a drain D contact of a transistor are prepared by applying a respective step of photo resist photolithography (PR). The contact openings are etched into the silicon nitride protective layer Si3N4 (also indicated as PSIN). A conductive metal layer MET0 is deposited in the etched contact openings. After applying another step of photo resist photolithography (PR), metal layer MET0 is etched and annealed in a further step. It should be noted that the deposited metal contact layer MET0 may comprise layers (e.g. a stack) of titanium, aluminum and titanium nitride (Ti/Al/TiN). After another step of photolithography the gate contacts for the gate of the transistor are etched.

Figure 3:
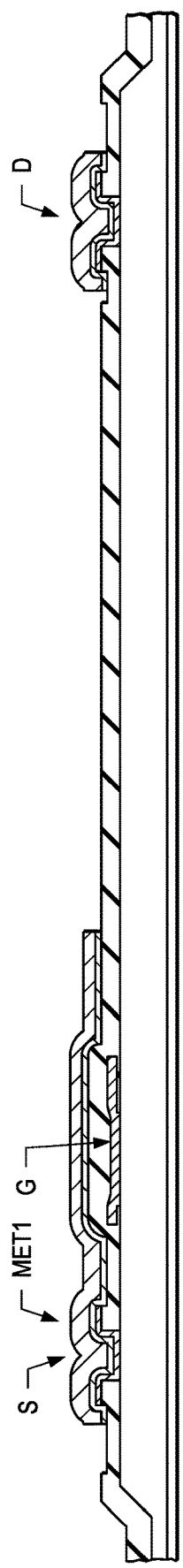
FIG. 3 is a cross sectional view of a second manufacturing stage that may follow the first manufacturing stage.

FIG. 3 is a cross sectional view of a second manufacturing stage that may follow the first manufacturing stage. In this stage a further metal layer MET1 is deposited. This metal layer MET1 may also comprise a layer of titanium tungsten (TiW), a layer of aluminum (Al) and a layer of titanium nitride (TiN). The metal layer MET1 can then also be etched.

Figure 4:
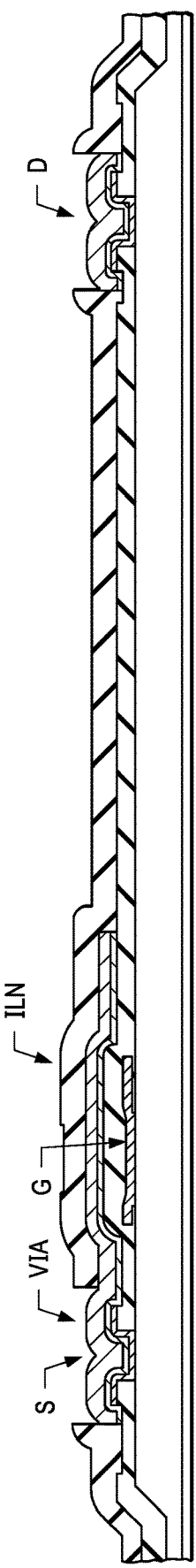
FIG. 4 is a cross sectional view of a third manufacturing stage that may follow the second manufacturing stage.

FIG. 4 is a cross sectional view of a third manufacturing stage that may follow the second manufacturing stage in which VIAs are formed. In this stage a silicon nitride layer Si3N4, also referred to as interlayer dielectric or interlayer nitride (ILN) is deposited. After a step of photo resist photolithography (PR) and etching, VIAs are provided in the layer of silicon nitride Si3N4. The VIAs serve to contact the source and drain contacts and the gates of one or more respective transistors. Once again, it is noted that the first stages rather relate to the manufacturing of a transistor and may be omitted if only one or more capacitors are to be manufactured.

Figure 5:
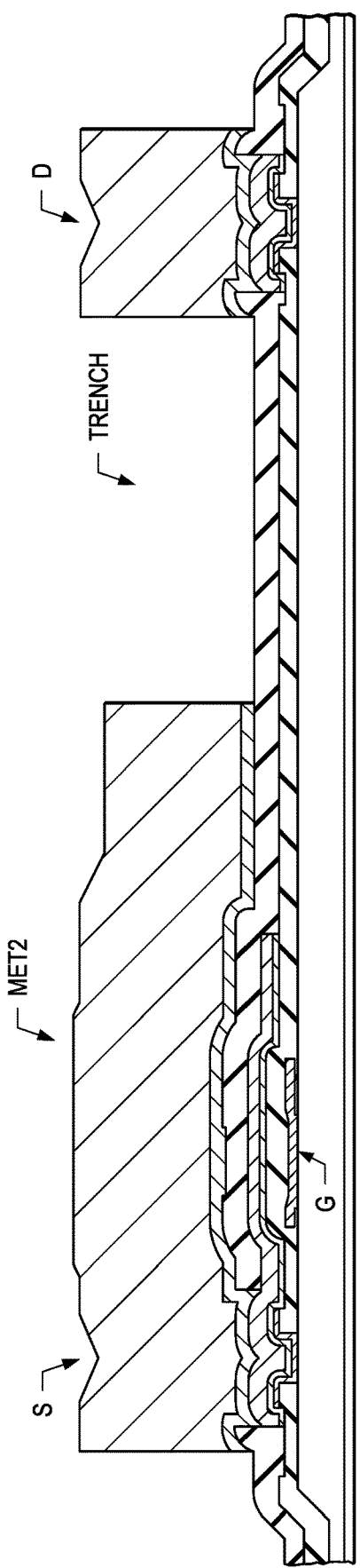
FIG. 5 is a cross sectional view of a fourth manufacturing stage that may follow the third manufacturing stage.

FIG. 5 is a cross sectional view of a fourth manufacturing stage that may follow the third manufacturing stage. In this stage another metal layer MET2 is deposited, structured with a step of photo resist photolithography and etched. This metal layer MET2 can also comprise layers of titanium tungsten (TiW), aluminum (Al) and titanium nitride (TiN). This metal layer MET2 is much thicker than the previous metal layers and therefore particularly well suited for providing the capacitor C of the present disclosure. This metal layer MET2forms a first structure E1 and a second structure E2 which are. the electrodes of the capacitor C. Metal layer MET2 may also serve as a contact layer for the transistor T.

Figure 6:
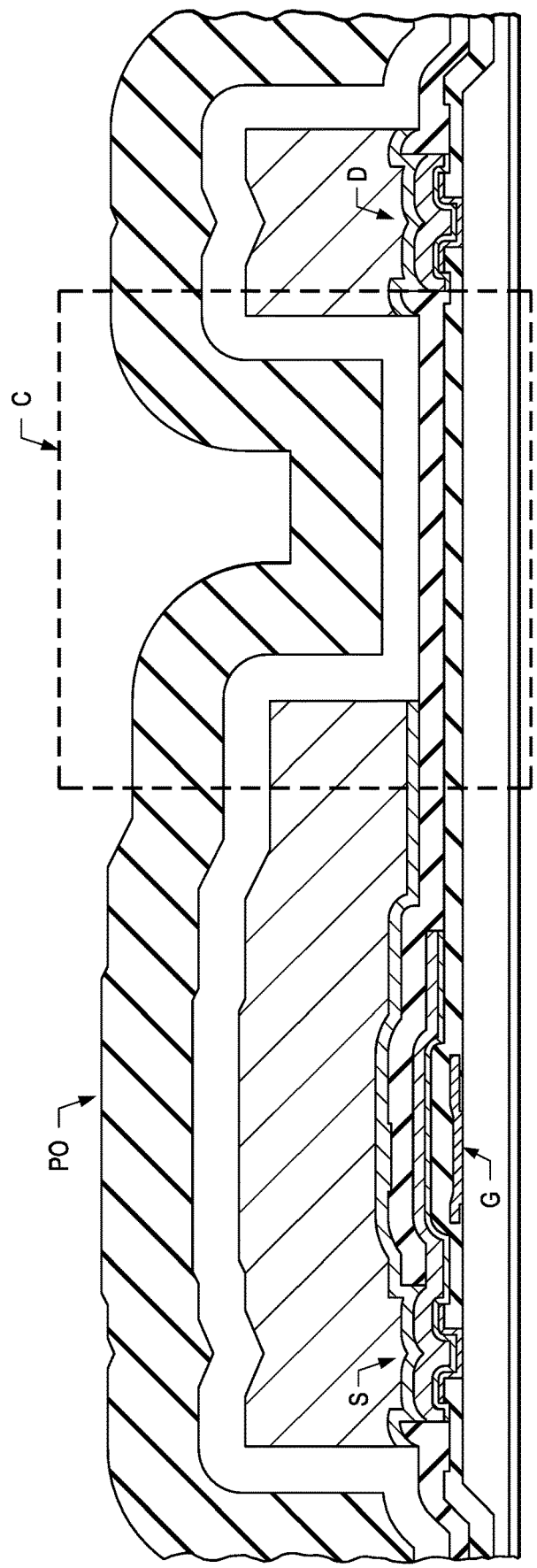
FIG. 6 is a cross sectional view of a fifth manufacturing stage that may follow the fourth manufacturing stage.

FIG. 6 is a cross sectional view of a fifth manufacturing stage that may follow the fourth manufacturing stage. In order to reduce stress of the rather thick silicon nitride Si3N4 layer that will be deposited on and between the metal layer MET2, a TEOS protective layer may be deposited. A step of sintering follows. The next steps are a step of photo resist photolithography and subsequent etching of the Scribe Line Area. Further, another layer of silicon nitride Si3N4 is deposited as a protective/dielectric layer. The layer of Si3N4 is then submitted to another step of photo resist photolithography and etching and finally sintered. The capacitor C is roughly indicated by a dashed line. However, it is apparent for those skilled in the art that the titanium tungsten TiW layers or other metal layers are not required for the capacitor C. The basic structure of C is more generally shown in FIG. 1.

Figure 7:
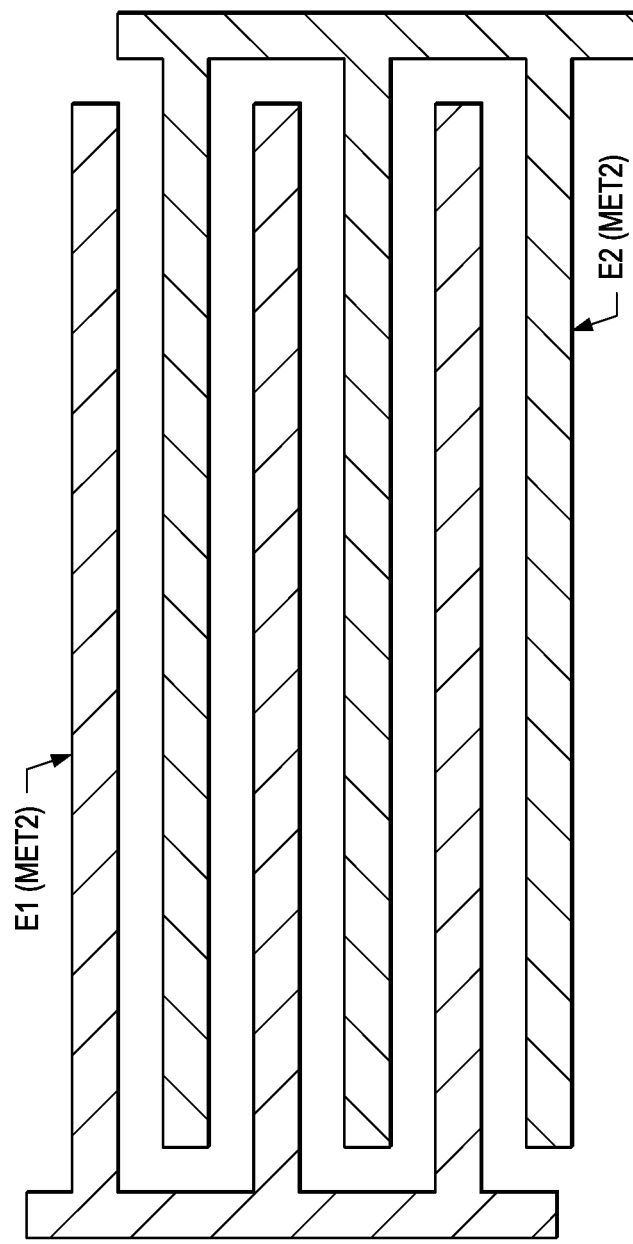
FIG. 7 is a simplified top view of on a metal layer of a capacitor according to the present disclosure.

FIG. 7 is a simplified top view of on a metal layer of a capacitor C according to the present disclosure. The first and second structures of the conductive layer MET2 of the first and second electrodes E1, E2 of the capacitor C can be interdigitated. This provides an increased area for the capacitor C.

Each of the electrodes E1 and E2 of the capacitor C at least comprises a single line. The electrodes E1 and E2 of the capacitor can further comprise several lines. The lines are located within the same level (intralevel) of metallization MET2 and can advantageously be interdigitated. In this structure the metal lines are of alternating voltages during operation.

In another embodiment, more than one metal layer, as for example MET1 and MET2 can be used simultaneously for the electrodes E1 and E2 of a capacitor. Accordingly, also a interlevel metallization structure combining MET1 and MET2 can be used in addition to the intralevel metallization. This further increases the sidewall area of the capacitor and thereby the capacitance.

Furthermore, it is also conceived that the minimum distance between the electrodes E1 and E2 is chosen and configured such that capacitors having different maximum voltage ratings are implemented. Accordingly, a manufacturing step can well comprise defining the minimum distance between the first electrode E1 and the second electrode E2 (and the respective metal layers of the electrodes E1, E2) such that a predetermined voltage rating is achieved. Moreover, this voltage rating (maximum voltage) can go beyond the one that is supported by the intrinsic back-end-of-line due to the limitation given by the vertical breakdown between two different metal layers (i.e. the breakdown limit between MET1 and MET2).

Figure 8A:
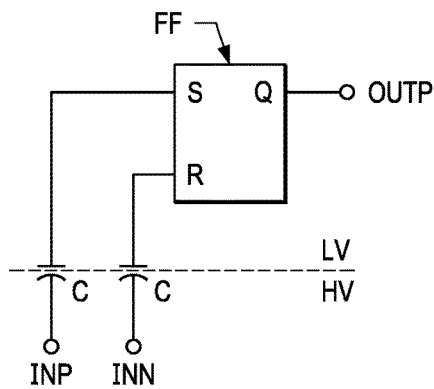
FIGS. 8A and 8B are simplified schematic circuit diagrams of circuits using capacitors in accordance with the present disclosure.
Figure 8B:
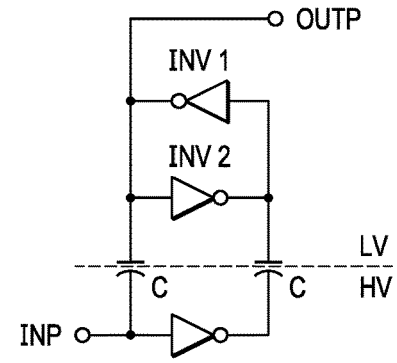

FIGS. 8A and 8B are two simplified schematic circuit diagrams of circuits using capacitors C in accordance with the present disclosure. Capacitors C are preferably used to couple a high voltage domain HV with a low voltage domain LV. One electrode E1 (or plate) of the capacitor can then be coupled to one domain (e.g. HV) and the other electrode E2 (or plate) can be coupled to the other domain (e.g. LV). The capacitor can thereby provide DC-isolation (DC=direct current) and/or AC-coupling (AC=alternate current). The dotted line indicates the voltage domain crossing. A level shifter according to the present disclosure can comprise a high density and high voltage capacitor C as described herein. A full or half bridge circuit may comprise such a level shifter comprising the capacitor C. The level shifter can be used bi-directionally. The low parasitic bottom plate capacitance reduces losses (quiescent current for changing reference potential, required energy per transferred edge). The two circuits shown in FIG. 8A and FIG. 8B are equivalent and only illustrate the potential use of a capacitor C in accordance with all the aspects and characteristics of the present disclosure. Accordingly, there may be a flip-flop, such as an RS-flip-flop FF. Each of the inputs of this flip-flop FF can be coupled to receive input signals INP and INN (e.g. inverse to INP) respectively, via a capacitor C. The input signals may then be signals of a high voltage domain HV, while the flip-flop (or any other logic components) FF is implemented in a low voltage domain. The technology used for the logic FF may then be one for low voltages, while the capacitors C (e.g. together with further components) can be implemented in a high voltage technology.

Figure 9A:
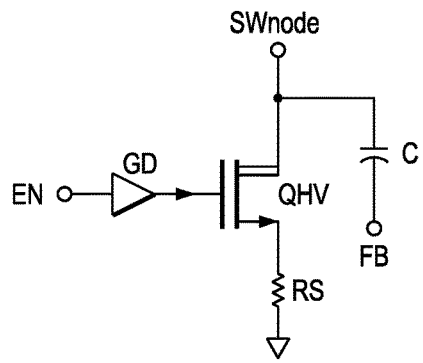
FIGS. 9A and 9B are simplified schematic circuit diagrams of circuits using capacitors in accordance with the present disclosure.
Figure 9B:
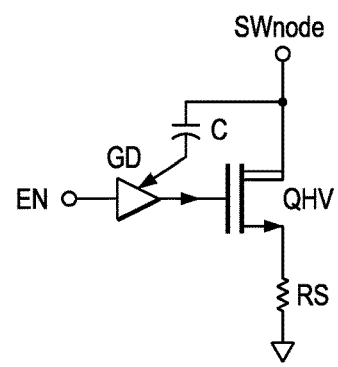

FIGS. 9A and 9B are a simplified schematic circuit diagrams of circuits using capacitors C in accordance with the present disclosure. Generally, a power converter or regulator may then comprise a capacitor C. The capacitor can be coupled to the switch node SW of the converter or regulator. The capacitor C can then provide a feedback current IFB=C*dV/dt. The capacitor C provides DC-isolation and voltage domain crossing. The feedback current IFB can be used in gate driver GD to control the slew rate of the power transistor QHV. An integrated electronic circuit may comprise a capacitor C and a power transistor QHV which are both monolithically manufactured in the same manufacturing process.

Figure 10A:
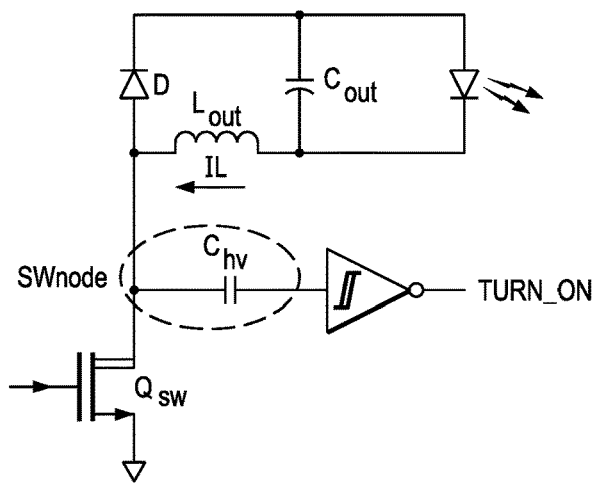
FIGS. 10A and 10B are simplified schematic circuit diagrams of circuits using capacitors in accordance with the present disclosure.
Figure 10B:
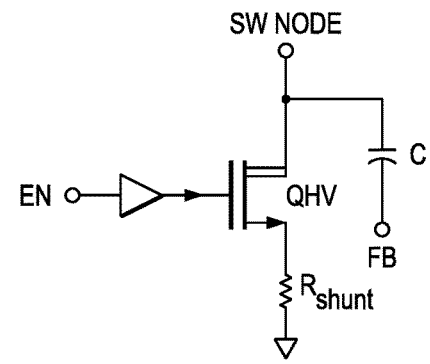

FIGS. 10A and 10B is a simplified schematic circuit diagrams of circuits using capacitors C in accordance with the present disclosure. Accordingly, the capacitor C may advantageously be used for zero current detection. The capacitor C can then serve to detect a falling edge at switch node SW. When the load current IL crosses zero (or becomes slightly negative), the switch node SW will be discharged quickly. The falling edge at the switch node SW can then be coupled though the capacitor C to the low voltage domain and may there be used to trigger a turn on event.

Figure 11:
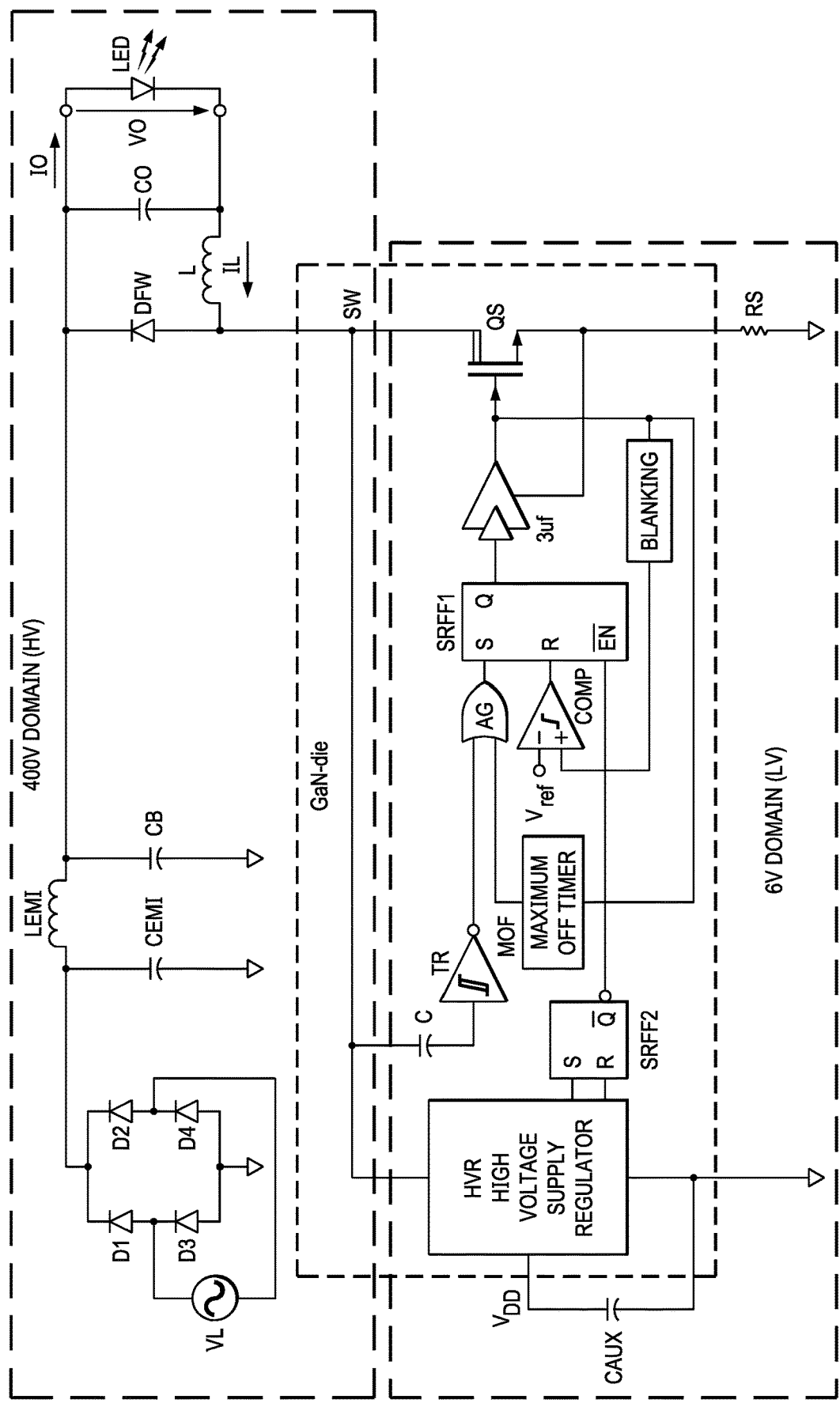
FIG. 11 is a simplified schematic circuit diagram of a circuit using a capacitor in accordance with the present disclosure.

FIG. 11 is a simplified schematic circuit diagram of a circuit using a capacitor in accordance with the present disclosure. The circuit is a voltage converter VC (buck converter). In the high voltage domain HV is the voltage level 400 V. The voltage converter VC comprises a capacitor C in accordance with the present disclosure. Moreover, various electronic components are integrated monolithically with the capacitor C. This is generally indicated by the dashed box "GaN-die" which indicates that all the parts and components in the dashed box are manufactured monolithically together in the same manufacturing process. This process can be a gallium nitride process as described in this disclosure.

There is a voltage supply VL that provides the high AC voltage which is rectified by diodes D1, D2, D3 and D4 and passed through a EMI (electromagnetic interference) filter comprising CEMI, LEMI and CB. The output of the EMI filter is coupled to the cathode of diode DFW a buffering capacitor CO and a load, which is a light emitting diode LED in the present example. The anode of diode DFW is coupled to one side of an inductor L. The other side of the inductor L is coupled to the capacitor CO and the cathode of the LED. The anode of diode DFW and the respective side of the inductor are coupled to the switch node SW. The dotted line indicates the transition between high voltage domain HV and low voltage domain LV. The GaN-die is coupled to both domains, the high voltage domain HV and the low voltage domain LV. The switch node SW also reaching high voltages HV is coupled to an input of the high voltage supply regulator HVR, one side (electrode) of the capacitor C and a drain contact of the power transistor QS. The capacitor C is coupled as feedback capacitor and supplies the actual voltage from switch node SW to an input of Schmitt trigger TR. The output of Schmitt trigger TR is coupled to an input of AND-gate AG. The output of AND-gate AG is coupled to the S-(set) input of SR-flip-flop SRFF. The other input of AND-gate AG is coupled to a maximum-off-timer MOF which defines a maximum off-time. The R-(reset) input of SRFF is coupled to the output of a comparator COMP. One input of the comparator COMP is coupled to a reference voltage VREF and the other input is coupled via a blanking block to the source of power transistor QS. The source of power transistor QS is also coupled to a shunt resistor RS which is further coupled to ground. Another SR-flip-flop SRFF2 is coupled with its inputs to HVR and with an output to an enable input of SRFF1. The entire circuit is just one example of an advantageous monolithic integration of capacitor C with other components, as for example a power transistor QS, and/or logic components etc. In this example the capacitor C (also high voltage capacitor HV-C) is used in a monolithic integration of a 400 V offline buck converter for zero current detection as described above.

Figure 12:
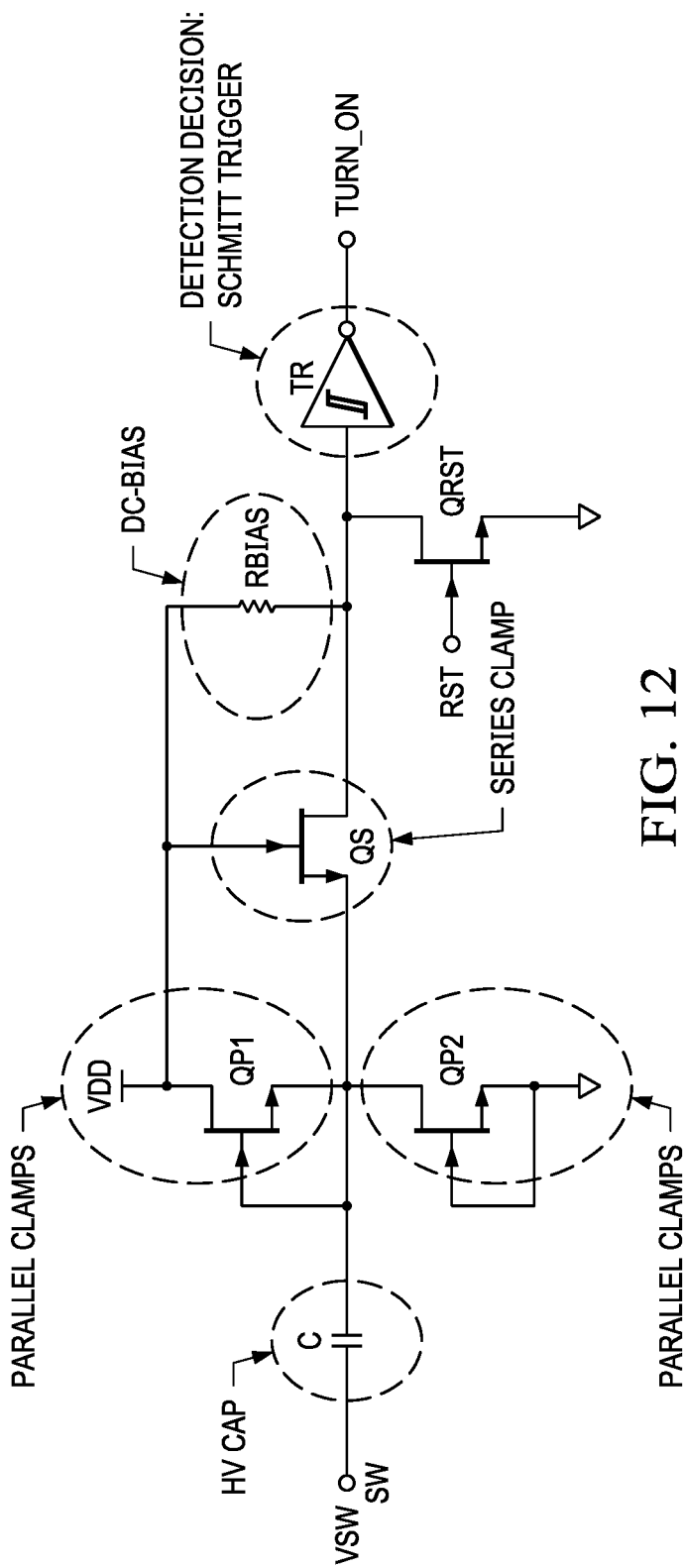
FIG. 12 is a simplified schematic circuit diagram of a circuit using capacitors in accordance with the present disclosure.

FIG. 12 is a simplified schematic circuit diagram of a detail that is not entirely shown in FIG. 11. Accordingly, the capacitor C (HV-C) is coupled with one electrode/side to switch node SW for receiving the respective voltage VSW. The other electrode/side of capacitor C is coupled to a gate and a source of a first clamp transistor QP1 and the drain of a second clamp transistor QP2. QP1 and QP2 form parallel clamps. Drain of QP1 is coupled to VDD and source and gate of QP2 are coupled to ground. Source of QP1 and drain of QP2 are also coupled to source of a series clamp transistor QS. Gate of QS is coupled to VDD. Drain of QS. A bias resistor RBIAS is coupled to VDD with one end and with the other end to a drain of QS. Furthermore, drain of QS is coupled to an input of Schmitt trigger TR. The channel of a reset transistor QRST is coupled between the input of Schmitt trigger TR and ground. The gate of QRST is coupled to receive a reset signal RST. The output of Schmitt trigger TR is coupled to turn on the power transistor QS shown in FIG. 11. In summary, clamp transistors QP1, QP2, QS, bias resistor RBIAS and reset transistor QRST are not shown in FIG. 11, but in FIG. 12 and can further assist in improving the circuit.

The manufacturing process for the capacitor C and the other components which are monolithically integrated together with the capacitor can be a III-Nitride power manufacturing process, in particular a Gallium Nitride (GaN) integrated circuit power platform process.

The above aspects and embodiments assist in providing a capacitor having high density (great capacitance), lower parasitic bottom plate capacitance and suitability for high voltage applications and respective integrated circuits comprising such a capacitor. The capacitor can well be integrated with other components such as power transistors etc.

Furthermore, the present disclosure provides a high density and high voltage fringe capacitor without adding to process complexity by adding manufacturing steps, mask count or requiring thick inter layer dielectrics (ILD) between metal layers. For example, the ILD thickness may be fixed because of various reasons such as field plate height for the high voltage field effect transistor (HV FET), in which case the voltage rating of the MIM cap will be fixed.

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

While the inventions have been described with primary reference to three metal layers, it will be readily recognized that these inventions can also be applied to process with one, two, three, or more layers of metal.

It should also be noted that the number of layers of metallization described above does not implicitly limit any of the claims, which can be applied to processes and structures with more or fewer layers.

Similarly, the teachings above are not necessarily strictly limited to silicon and gallium nitride and silicon nitride. In alternative embodiments, it is contemplated that these teachings can also be applied to structures and methods using other semiconductors, such as silicon/germanium and related alloys, gallium arsenide and related compounds and alloys, indium phosphide and related compounds, and other semiconductors, including layered heterogeneous structures.

It should also be noted that, over time, an increasing number of functions tend to be combined into a single chip. The disclosed inventions can still be advantageous even with different allocations of functions among chips, as long as the functional principles of operation described above are still observed.

The invention claimed is:

1. An integrated circuit, comprising:
a transistor including a source, a drain, and a gate located between the source and the drain, wherein a metallic member is connected to the source and extends toward the drain over the gate, the metallic member including a side facing the drain and terminated between the gate and the drain; and
a capacitor including a first structure made of a metallic layer, a second structure made of the metallic layer, and a dielectric layer laterally disposed between the first structure and the second structure, wherein the first structure is connected to the metallic member and extended above the metallic member, and the second structure is electrically connected to and located above the drain.

2. The integrated circuit of claim 1, wherein the dielectric layer comprises silicon nitride.

3. The integrated circuit of claim 1, wherein the metallic layer comprises aluminum.

4. The integrated circuit of claim 1, wherein the first structure and the second structure are interdigitated.

5. A monolithic integrated circuit, comprising:
a capacitor including first and second electrodes formed of a metallic layer and an intralayer dielectric between the first and second electrodes; and
a transistor including a source, a drain, and a gate located between the source and the drain, wherein a metallic member is connected to the source and extends toward the drain over the gate, the metallic member including a side facing the drain and terminated between the gate and the drain, wherein
the first electrode is connected to the metallic member and extended above the metallic member; and
the second electrode is electrically connected to and located above the drain.

6. The monolithic integrated circuit of claim 5, wherein the first and second electrodes of the capacitor are configured to be coupled to a high voltage power domain and a low voltage power domain coupled to a level shifter, respectively.

7. The monolithic integrated circuit of claim 5, wherein the capacitor is configured as a feedback capacitor in a voltage or current converter.

8. The monolithic integrated circuit of claim 5, wherein the capacitor is configured to serve for zero detection of a varying voltage.

9. The monolithic integrated circuit of claim 5, wherein the capacitor is electrically coupled to a switch node of a power converter.

10. The monolithic integrated circuit of claim 5, further comprising at least one of a Schmitt trigger, a logic gate, a flip-flop, a buffer, a logic control stage.

11. The integrated circuit of claim 1, wherein the dielectric layer comprises a tetraethoxysilane (TEOS) layer contacting the first and second structures and a silicon nitride (Si3N4) layer on the TEOS layer.

12. The integrated circuit of claim 1, wherein the dielectric layer between the first and second structures is located above a region of the transistor, the region located between the gate and the drain.

13. The integrated circuit of claim 1, wherein the capacitor is located above the transistor.

14. The integrated circuit of claim 1, wherein the metallic layer has a thickness greater than 1 micrometer.

15. The integrated circuit of claim 1, wherein the metallic layer has a thickness greater than 3 micrometer.

16. The integrated circuit of claim 1, wherein the metallic layer is a first metal layer, the integrated circuit further comprising:
third and fourth structures made of a second metal layer, wherein:
the third structure stacked on the first structure;
the fourth structure stacked on the second structure; and
the dielectric layer includes a portion between the third and fourth structure.

17. The integrated circuit of claim 1, wherein the transistor includes a layer of III-V semiconductor material disposed on a silicon substrate.

18. The monolithic integrated circuit of claim 7, wherein the voltage or current converter includes a DC-DC converter.

19. The monolithic integrated circuit of claim 7, wherein the voltage or current converter includes a buck or boost converter.

20. The monolithic integrated circuit of claim 5, wherein the transistor includes a layer of III-V semiconductor material disposed on a silicon substrate.

* * * * *